(12) United States Patent
Samukawa et al.

(10) Patent No.: US 7,868,109 B2
(45) Date of Patent: Jan. 11, 2011

(54) CURABLE RESIN COMPOSITION

(75) Inventors: Hiroshi Samukawa, Tochigi (JP); Kouki Hatsuda, Tochigi (JP)

(73) Assignees: Sony Corporation, Tokyo (JP); Sony Chemical & Information Device Corporation, Tokyo (JP)

( * ) Notice: Subject to any disclaimer, the term of this patent is extended or adjusted under 35 U.S.C. 154(b) by 456 days.

(21) Appl. No.: 12/084,707

(22) PCT Filed: Mar. 14, 2007

(86) PCT No.: PCT/JP2007/055063

§ 371 (c)(1), (2), (4) Date: May 8, 2008

(87) PCT Pub. No.: WO2007/116625

PCT Pub. Date: Oct. 18, 2007

(65) Prior Publication Data

US 2009/0143505 A1  Jun. 4, 2009

(30) Foreign Application Priority Data

Apr. 10, 2006  (JP) .............................. 2006-108111

(51) Int. Cl.
- *C08K 5/3417* (2006.01)
- *C08L 33/06* (2006.01)
- *C08L 39/04* (2006.01)
- *C08F 20/10* (2006.01)

(52) U.S. Cl. ........................ 526/204; 526/259; 526/263

(58) Field of Classification Search ................. 526/204, 526/259, 263

See application file for complete search history.

(56) References Cited

U.S. PATENT DOCUMENTS

| 4,664,997 | A  | * | 5/1987 | Suzuki et al. .............. 430/59.5 |
| 6,756,449 | B2 | * | 6/2004 | Benz et al. ................ 525/326.9 |

FOREIGN PATENT DOCUMENTS

| EP | 1 342 557 A1 | 9/2003 |
| EP | 1342557 A1 * | 9/2003 |
| JP | A 58-186976 | 11/1983 |
| JP | A 3-71680 | 3/1991 |
| JP | A 5-80308 | 4/1993 |
| JP | A 2002-293762 | 10/2002 |
| JP | 2003040940 A * | 2/2003 |
| JP | A 2003-40940 | 2/2003 |
| JP | A 2004-15063 | 1/2004 |
| JP | A 2004-126499 | 4/2004 |

* cited by examiner

*Primary Examiner*—Kelechi C Egwim
(74) *Attorney, Agent, or Firm*—Oliff & Berridge, PLC

(57) ABSTRACT

A curable resin composition is provided which has an appropriate viscosity suitable for encapsulating a light-emitting device. The cured product of the curable resin composition has a refractive index equal to or larger than that of epoxy resins, is excellent in heat resistance and light resistance, and has thermal stress relaxation properties. The curable resin composition contains a high refractive index acrylic-based monomer having a refractive index of 1.52 or more and a non-polymerizable carbazole, and further contains a polymerizable carbazole in accordance with need. An acrylate or methacrylate having a fluorene skeleton, a bisphenol-A skeleton, a biphenyl skeleton, a naphthalene skeleton, or an anthracene skeleton is used as the high refractive index acrylic-based monomer.

11 Claims, No Drawings

CURABLE RESIN COMPOSITION

TECHNICAL FIELD

The present invention relates to a curable resin composition useful for encapsulation or the like of optical devices.

BACKGROUND ART

Light-emitting devices such as light-emitting diodes (LEDs) have features such as low power consumption, small size, and light weight, and light-emitting devices encapsulated with resins are used in various types of lamps and the like. In recent years, blue LEDs and white LEDs have been developed, and the luminance of LEDs has also been increased. Hence, the use of LEDs is expanding rapidly in applications such as a backlight light source for liquid crystal display panels, a light source for illumination, and signal lamps. Furthermore, the application of LEDs to headlamps for use in automobiles is being developed.

Conventionally, epoxy resins of bisphenol A glycidyl ether type having a refractive index of 1.53 to 1.57 have been used as an encapsulating resin for LEDs. However, with the increase in luminance of LEDs, the temperature of the LEDs during operation increases, and therefore the encapsulating material for the LEDs is exposed to high temperature and high intensity light. In such a circumstance, the heat resistance and light resistance (in particular, resistance to UV and blue light) of conventional encapsulating resins composed of epoxy resins are insufficient. Therefore, the encapsulating resins are discolored, and this causes a problem that the luminance of the LEDs deteriorates with time. With regard to this problem, highly transparent epoxy resins have been developed. However, the heat resistance and light resistance of such resins are still not satisfactory.

In view of the above, gel-type silicone resins have been used in high-intensity LEDs since they are excellent in heat resistance and light resistance as compared with epoxy resins. However, the gel-type silicone resins have the following problems.

First, the surface of these silicone resins is sticky, so that a problem arises in that dust and dirt easily adhere thereto. Therefore, at present, the silicone resins are limited to be used as a resin for filling a gap formed after a dome portion having a lens function is joined with the base of an LED chip and to be used as an encapsulating resin when an LED is to be surface mounted.

Second, since the refractive index of the silicone resins is in the range of 1.41 to 1.51 being smaller than that of epoxy resins, the light extraction efficiency from LEDs deteriorate when the silicone resins are used for encapsulation. Specifically, in high intensity LEDs, a sapphire substrate is often used as a chip substrate thereof, and a certain method is mainly employed in which light is extracted from the sapphire substrate side. The refractive index of sapphire is 1.76. Thus, in order to efficiently extract light from the sapphire substrate into an encapsulating resin, it is preferable that the refractive index of the encapsulating resin be close to the refractive index of sapphire. However, among the silicone resins, generally used dimethyl silicone resin has a refractive index of 1.41. Furthermore, diphenyl dimethyl-based and phenyl methyl-based silicone resins, into which a phenyl group has been introduced to increase the refractive index, have a refractive index of about 1.51. Thus, the refractive index of such silicone resins is less than that of epoxy resins being in the range of 1.53 to 1.57. Therefore, when a silicone resin is used as the encapsulating resin for high-intensity LEDs, it is inevitable that the light extraction efficiency is lower than that when an epoxy resin is used.

Third, since the silicone resins used in electronic materials are of an addition reaction type and are a two-part resin, the two parts are required to be mixed immediately before use. Generally, the two parts are mixed using a static mixer. However, this mixer can mix only relatively low viscosity materials, and therefore it is difficult to obtain a resin composition having a sufficiently high viscosity after the mixing of the two parts. Hence, such resins cannot be molded into a predetermined lens shape, and a lens function cannot be imparted to the encapsulating resins.

A technique has been proposed for the refractive index problem among the problems in the silicone resins (Patent Document 1). Specifically, in this technique, the refractive index of a resin composition is increased by adding fine particles of titanium oxide, zirconium oxide, zinc oxide, or the like having a high refractive index to the resin. However, in order to increase the refractive index of the silicone resins to higher than that of epoxy resins by means of this technique, at least 10 to 40% by volume of the fine particles must be added to the resin. Therefore, the addition of the fine particles rather deteriorates the transparency. Moreover, it is difficult to obtain fluidity necessary for use as an encapsulating resin. Furthermore, there is an attempt to improve the transparency by using fine particles called single-nano size. However, the cohesive force of the ultrafine particles of single-nano size is very strong, and therefore it is very difficult to uniformly disperse the ultrafine particles in a resin without formation of secondary aggregated particles. Therefore, a technology for encapsulating LEDs with a resin in which such fine particles are used has not been practically realized.

Meanwhile, it has been proposed that a fluorene group-containing monoacrylate is used as a high-refractive index resin used in the manufacturing of an optical antireflective film (Patent Document 2). This compound may be considered to be used as an encapsulating resin for LEDs.

However, since fluorene group-containing monoacrylates have very high viscosity, its handleability as an encapsulating agent is insufficient. When a low-viscosity diluent monomer such as 2-hydroxyethyl acrylate is added to a fluorene group-containing monoacrylate, the viscosity of the composition can be reduced. However, a problem arises in that the use of the diluent monomer limits the refractive index to at most 1.58 to 1.61. Furthermore, this composition is very hard after curing. Hence, when the composition is used as an encapsulating resin for LEDs, thermal stress may cause problems such as peeling between the resin and the chip, breakage of the chip, and a break in wiring.

[Patent Document 1] Japanese Patent Application Laid-Open No. 2004-15063.

[Patent Document 2] Japanese Patent Application Laid-Open No. 2002-293762.

DISCLOSURE OF THE INVENTION

Problems to be Solved by the Invention

In view of the above problems in the conventional technology, it is an object of the present invention to provide a curable resin composition having a viscosity suitable for forming an encapsulating resin for LEDs. Specifically, the cured product of the resin composition has a refractive index at least equal to or greater than that of epoxy resins and is excellent in heat resistance and light resistance, and the resin composition has an appropriate viscosity. In addition, in an LED encapsulated with the resin composition, failures such as peeling of the encapsulating resin, breakage of the chip, and a break in wiring are prevented from occurring. Moreover, it is another object of the present invention to provide a cured product of such a resin composition and an optical device encapsulated with the cured product thereof.

Means for Solving the Problems

The present inventors have found that a resin composition in which a non-polymerizable carbazole is mixed into a high refractive index acrylic-based monomer such as a fluorene group-containing acrylate serves as a one-part curable resin composition having an appropriate viscosity. The inventors have also found that the refractive index of the cured product of the resin composition is equal to or greater than that of epoxy resins, or 1.55 or more, and that the cured product is excellent in heat resistance and light resistance and has a hardness suitable for an encapsulating resin. Thus, the present invention has been completed.

Accordingly, the present invention provides a curable resin composition comprising a high refractive index acrylic-based monomer having a refractive index of 1.52 or more and a non-polymerizable carbazole.

Moreover, the present invention provides a cured product formed by curing the curable resin composition, and in particular, provides a light-emitting device encapsulated with the curable resin composition.

Effects of the Invention

According to the present invention, the following effects can be obtained.

First, the resin composition of the present invention is a one-part resin composition which can be easily cured by applying heat or UV irradiation, and therefore there is no limitation on the pot life. Furthermore, viscosity adjustment can be made so that the viscosity can be adjusted according to a specific application. Therefore, the resin composition of the present invention is excellent in handleability.

Second, the cured product of this resin composition has a dry touch, i.e., has a non-sticky surface, and has a self shape-retaining property. Therefore, this cured product can exhibit a lens function in addition to an encapsulating function.

Third, this cured product is not as hard as the cured product of fluorene group-containing monoacrylates and has thermal stress relaxation properties. Therefore, LED chips do not suffer from thermal stress, and the problems of the deterioration of the chips due to encapsulation failure and a break in wiring due to thermal stress can be resolved.

Fourth, the refractive index of the cured product is equal to or greater than that of epoxy resins, or 1.55 or more. Therefore, the light extraction efficiency from a sapphire substrate of LEDs can be improved.

Fifth, the cured product is excellent in heat resistance and light resistance so that the transparency thereof can be maintained for a certain period of time. Therefore, according to the cured product, when high intensity LEDs are encapsulated therewith, the variation with time of the light emission amount can be reduced.

BEST MODE FOR CARRYING OUT THE INVENTION

Hereinafter, the present invention will be described in detail. In the following description, the term "(meth)acrylate" means acrylate or methacrylate.

A curable resin composition of the present invention contains a high refractive index acrylic-based monomer having a refractive index of 1.52 or more and a non-polymerizable carbazole.

Here, the refractive index is the value measured at 25° C. using the light of sodium D line (589 nm). The refractive index of the acrylic-based monomer strongly affects the refractive index of the cured product. Therefore, in the present invention, a high refractive index acrylic-based monomer having a refractive index of 1.52 or more is employed.

Examples of such a high refractive index acrylic-based monomer include (meth)acrylates having two or more phenyl groups in their molecules, i.e., having a fluorene skeleton, a bisphenol-A skeleton, a biphenyl skeleton, a naphthalene skeleton, an anthracene skeleton, or the like. These exhibit excellent solubility characteristics with the non-polymerizable carbazole.

Examples of the fluorene group-containing acrylic-based monomers among the high refractive index acrylic-based monomers include a compound of the following formula (1):

[Chemical Formula 1]

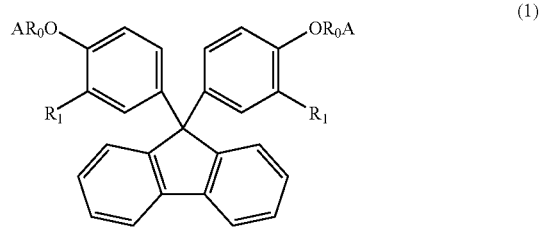

where A is an acrylic group or a methacrylic group, $R_0$ is —$(CH_2CH_2O)_n$— or —$(CH_2CH_2O)_n$—$CH_2CH(OH)CH_2O$— with n being 1 to 5, and $R_1$ is a hydrogen atom or a methyl group.

The fluorene group-containing (meth)acrylate of the formula (1) is preferable since it has a refractive index equal to or higher than that of epoxy resins and is excellent in heat resistance and light resistance. In the formula (1), n larger than 5 is not preferred since the refractive index becomes too small.

A commercially available product may be used as the fluorene group-containing (meth)acrylate of the formula (1). Examples of the commercially available product include: 9,9-bis(4-(2-acryloxyethoxy)phenyl)fluorene represented by the following formula (1a):

[Chemical Formula 2]

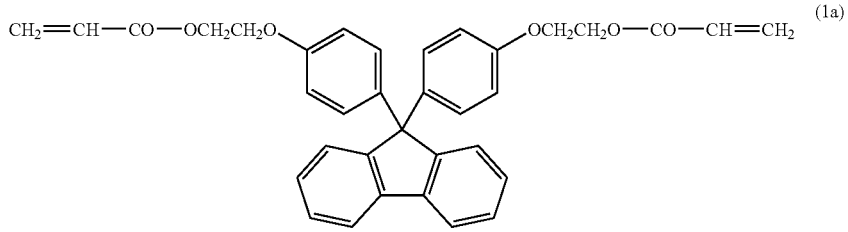

(Osaka Gas Chemicals Co., Ltd., BPEF-A, refractive index: 1.614); and 9,9-bis(4-(2-(3-acryloyl-2-hydroxypropoxy)ethoxy)phenyl) fluorene represented by the following formula (1b):

[Chemical Formula 3]

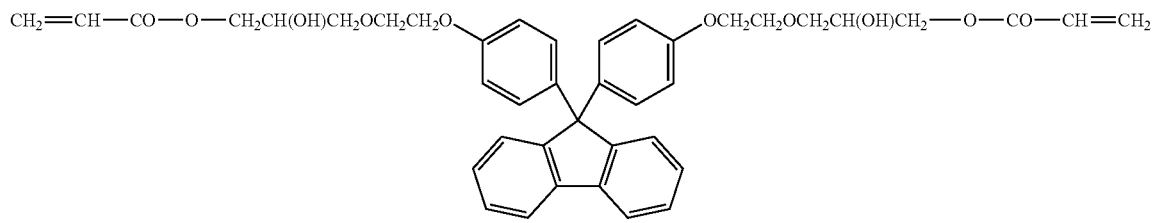

(1b)

(Osaka Gas Chemicals Co., Ltd., refractive index: 1.574).

The curable resin composition of the present invention may contain one or more types of the fluorene group-containing (meth)acrylates of formula (1).

Examples of the high-refractive index acrylic-based monomer not containing a fluorene group include a monofunctional (meth)acrylate represented by the following formula (2):

[Chemical Formula 4]

(2)

(where A is an acrylic or methacrylic group, X is a phenyl group, a cumylphenyl group, a biphenyl group, a terphenyl group, or a polycyclic aromatic hydrocarbon group, and Y is $-(CH_2CH_2O)_n-$ or $-(CH_2CH_2CH_2O)_n$ with n being 1 to 5 or is $-(CH_2CH_2O)_{n1}-(CH_2CH_2CH_2O)_{n2}-$ with n1+n2 being 2 to 5).

In the formula (2), examples of the polycyclic aromatic hydrocarbon group represented by X include naphthalene, dinaphthalene, anthracene, and pyrene.

A commercially available product may be used as the monofunctional (meth)acrylate of the formula (2). Examples of the commercially available product include paracumylphenoxyethyl acrylate represented by the following formula (2a):

[Chemical Formula 5]

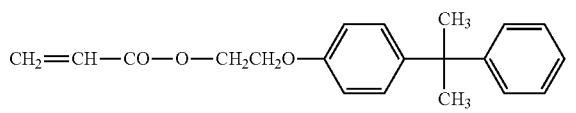

(2a)

(TOAGOSEI CO., LTD., ARONIX M110, refractive index of monomer: 1.5542, viscosity: 125 mPa) and 2-(2-acryloxyethoxy)biphenyl represented by the following formula (2b):

[Chemical Formula 6]

$CH_2=CH-CO-O-CH_2CH_2O-$ (2b)

(TOAGOSEI CO., LTD., TO1463, refractive index of monomer: 1.5785, viscosity: 125 mPa).

In the present invention, a single type of the monofunctional (meth)acrylates of the formula (2) or a suitable combination of two or more thereof may be used.

Other examples of the high-refractive index acrylic-based monomer not containing a fluorene group include bifunctional (meth)acrylates. Examples of the bifunctional (meth)acrylates include 2,2-bis[4-(acryloyloxyethoxy)phenyl]propane, 2,2-bis[4-(acryloyloxydiethoxy)phenyl]propane, 2,2-bis[4-(methacryloyloxyethoxy)phenyl]propane, 2,2-bis[4-(methacryloyloxydiethoxy)phenyl]propane, 2,2-bis[4-(acryloyloxypropoxy)phenyl]propane, and 2,2-bis[4-(methacryloyloxypropoxy)phenyl]propane. A suitable combination of these may also be used.

Moreover, the above fluorene group-containing (meth)acrylate of the formula (1), the above monofunctional (meth)acrylate of the formula (2), and the above bifunctional (meth)acrylate may be used in combination.

Meanwhile, in the present invention, the non-polymerizable carbazole is a carbazole which does not exhibit polymerizability under the curing conditions of the curable resin composition of the present invention, i.e., under UV irradiation or heat treatment at 80 to 150° C. A composition containing the non-polymerizable carbazole and the high refractive index acrylic-based monomer has a viscosity suitable for an encapsulating resin, and the cured product thereof has a high refractive index of 1.55 to 1.67 and is excellent in transparency.

Generally, a polymerizable carbazole has toxicity. However, the non-polymerizable carbazole has less toxicity and is not co-polymerized when the resin composition is cured. Therefore, the hardness of the cured product can be reduced. Hence, in the present invention, the non-polymerizable carbazole is used as an essential component.

Examples of the non-polymerizable carbazole include N-substituted carbazoles represented by the following formula (3):

[Chemical Formula 7]

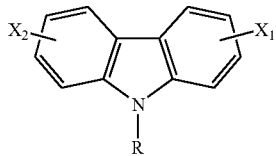

(3)

(where R is a hydrogen atom, a methyl group, an ethyl group, or a phenyl group, and X1 and X2 are each a hydrogen atom, a methyl group, a methoxy group, or a hydroxyl group).

Among the non-polymerizable carbazoles of the formula (3), N-phenyl carbazole (N=1.68) or the like is preferred since it has a high refractive index.

Moreover, a cured product which is a polymer of a polymerizable carbazole monomer may be used as the non-polymerizable carbazole. This cured product has a refractive index higher than that of the polymerizable carbazole, being the monomer thereof, and therefore is preferred. Furthermore, the viscosity of the resin composition can be adjusted to a high value using this cured product of the polymerizable carbazole. Therefore, the curable resin composition of the present invention can be suitably used when a lens and the like are molded simultaneously at the time of encapsulating an optical device.

Examples of the cured product of the polymerizable carbazole include powder of the cured product of N-vinylcarbazole (N=1.68), powder of the cured product of N-(2-acryloyloxyethyl)carbazole (N=1.64), powder of the cured product of N-(2-methacryloyloxyethyl)carbazole, powder of the cured product of N-allylcarbazole, and powder of the cured product of N-(p-vinylbenzyl)carbazole. Of these, the powder of the cured product of N-vinylcarbazole, the powder of the cured product of N-(2-acryloyloxyethyl)carbazole, and the like are preferred since they have high refractive index.

If necessary, the curable resin composition of the present invention may contain, in addition to the high refractive index acrylic-based monomer and the non-polymerizable carbazole, an additional monomer in order to adjust the physical properties such as the viscosity and curing rate of the composition, and the refractive index, transparency, light resistance, and heat resistance of the cured product.

For example, a polymerizable carbazole such as N-vinylcarbazole, N-(2-acryloyloxyethyl)carbazole, N-(2-methacryloyloxyethyl)carbazole, N-allylcarbazole, or N-(p-vinylbenzyl)carbazole may be used in order to prevent the non-polymerizable carbazole from precipitating. The polymerizable carbazole can be co-polymerized with the acrylic-based monomer, and the obtained co-polymer exhibits excellent compatibility with the non-polymerizable carbazole. Therefore, using the polymerizable carbazole together with the high refractive index acrylic-based monomer and the non-polymerizable carbazole, the precipitation of the non-polymerizable carbazole can be reliably prevented in the curable resin composition of the present invention.

In addition to the above, a monomer which can impart flexibility to the cured product is preferably added as the additional monomer. Such a monomer is added in order to relax the stress due to strain caused when the curable resin composition cures and shrinks and to relax the thermal stress due to the thermal expansion of the cured product, whereby a chip and wiring encapsulated with the cured product are prevented from deteriorating and a break in the wiring is prevented. Examples of the monomer effective for imparting flexibility include monomers which give a cured product having a glass transition point equal to or below room temperature. Such monomers include, for example, butyl(meth)acrylate, 2-ethylhexyl(meth)acrylate, 2-methoxyethyl(meth)acrylate, 3-methoxybutyl(meth)acrylate, phenol EO-modified (meth)acrylate (EO addition number: 1 to 5), phenol PO-modified (meth)acrylate (PO addition number: 1 to 5), methylphenyl EO-modified (meth)acrylate (EO addition number: 1 to 5), methylphenyl PO modified (meth)acrylate (PO addition number: 1 to 5), nonylphenyl EO modified (meth)acrylate (EO addition number: 1 to 5), nonylphenyl PO modified (meth)acrylate (PO addition number: 1 to 5), and 2-hydroxy-3-phenoxypropyl (meth)acrylate. Of these, a monomer having a phenyl group in their molecules is preferred since they have high refractive index.

However, the refractive index of such a monomer is generally less than 1.52. Hence, when a large amount of such a monomer is added, the cured product of the curable resin composition of the present invention cannot have a refractive index of 1.55 or more. Therefore, normally the addition amount of such a monomer is preferably 50% by weight or less in the curable resin composition.

Moreover, a monomer which improves the transparency of the cured product is preferably added as the additional monomer. The transparency includes transparency in the visible light region and transparency in the ultraviolet region. Conventionally, an encapsulating material for LEDs is necessarily required to have transparency in the visible light region. Meanwhile, in the present invention, it is preferable to increase the transparency in the ultraviolet region, in addition to the transparency in the visible light region, to thereby prevent UV light and blue light from being easily absorbed by the cured product.

The transparency in the ultraviolet region can be evaluated by measuring the cut-off wavelength of the cured product. As used herein, the cut-off wavelength is a wavelength at which the light transmittance decreasing from the visible light region toward the ultraviolet region becomes zero in the cured product. When the cut-off wavelength is short, UV light and blue light emitted from an LED is not easily absorbed by the cured product. Hence, not only luminance loss can be prevented, but also the deterioration of the cured product due to such light can be prevented since such light is not absorbed. Therefore, the transparency of the cured product can be maintained for a long period of time. Accordingly, in the present invention, it is preferable to add a monomer which increases the transparency of the cured product in both the visible and ultraviolet regions.

As the above monomer, a monomer not having a benzene ring in its structure but having an alicyclic structure is preferred since it has a high transparency and a high refractive index. More specific examples of such a monomer include cyclohexyl (meth)acrylate, dicyclopentenyl (meth)acrylate, tricyclodecanyl (meth)acrylate, isobornyl (meth)acrylate, and adamantyl (meth)acrylate.

In the mixing ratio of the resin components of the curable resin composition, the total amount of the high refractive index acrylic-based monomer and the non-polymerizable carbazole (or, when the polymerizable carbazole is contained, the total amount including the amount thereof) is preferably 50% by weight or more. When the total amount of the high refractive index acrylic-based monomer, the non-polymerizable carbazole, and the polymerizable carbazole is less than 50% by weight, it is difficult to adjust the refractive index of the cured product of the curable resin composition of the present invention to 1.55 or more.

When the polymerizable carbazole is not contained, the mixing amount of the non-polymerizable carbazole is preferably 5% by weight or more to 55% by weight or less with respect to the total amount of the high refractive index acrylic-based monomer and the non-polymerizable carbazole. When the polymerizable carbazole is contained, the mixing amount is preferably 5% by weight or more and 65% by weight or less. When the mixing amount of the non-polymerizable carbazole is too large, the non-polymerizable carbazole does not easily dissolve in the acrylic-based monomer. Even when the non-polymerizable carbazole dissolves in the acrylic-based monomer, the non-polymerizable carbazole may precipitate after curing, whereby the cured product may be whitened. On the contrary, when the amount of the non-polymerizable carbazole is too small, the refractive index cannot be increased.

As a curing agent for the curable resin composition of the present invention, a radical curing agent such as a peroxide or an azo compound, a UV curing agent, or the like may be used. The mixing amount of the curing agent is preferably 0.1 to 5 parts by weight, and more preferably 0.3 to 1 part by weight with respect to 100 parts by weight of the total amount of the high refractive index acrylic-based monomer and the non-polymerizable carbazole.

Moreover, in order to further increase the refractive index of the cured product, high-refractive index ultra-fine particles may be added to the curable resin composition of the present invention. The high-refractive index ultra-fine particles are transparent fine particles composed of a metal oxide such as titanium oxide, zirconium oxide, zinc oxide, aluminum oxide, or magnesium oxide and having a refractive index of 1.6 or more and a diameter of 20 nm or less, and more preferably 9 nm or less (called single-nano size). Preferably, the surface of the high-refractive index ultra-fine particles is subjected to hydrophobic treatment, in order to improve the dispersion properties. Normally, the mixing amount of the high-refractive index ultra-fine particles is preferably 1 to 40 parts by weight with respect to 100 parts by weight of the total of the high refractive index acrylic-based monomer and the carbazoles (being the non-polymerizable carbazole and the polymerizable carbazole).

In addition, a polymerization inhibitor and other various additives may be added to the curable resin composition of the present invention. For example, as the polymerization inhibitor, 25 to 1000 ppm of hydroquinone, methoquinone, BHT, or the like may be added. Furthermore, as a thixotropy imparting agent, silicon oxide fine particles such as aerosol may be added. Moreover, a coloring dye, a YAG phosphor, or the like may be added in order to convert the wavelength of the light emitted from an LED.

The curable resin composition of the present invention can be obtained as a liquid composition by mixing the high refractive index acrylic-based monomer with the non-polymerizable carbazole, the polymerizable carbazole added in accordance with need, and other components by means of a routine method.

This curable resin composition can be cured by heating treatment at a temperature of 80 to 150° C. or by UV irradiation. Moreover, the resin composition can be suitably used as an optically encapsulating curable resin composition for LEDs, optical discs, and light-emitting devices such as lasers. Therefore, the present invention includes light-emitting devices encapsulated with the resin composition of the present invention.

EXAMPLES

Hereinafter, the present invention will be described in detail by way of Examples.

Example 1

(1) Preparation of Curable Resin Composition

Powder of the cured product of N-vinylcarbazole (Tokyo Chemical Industry Co., Ltd., refractive index: 1.68) was dissolved in 2-(2-acryloxyethoxy)biphenyl (TOAGOSEI CO., LTD., TO1463, refractive index: 1.5785, viscosity 125 mPa) in a ratio shown in Table 1. Furthermore, 1 part by weight of a photoinitiator (Ciba Specialty Chemicals, D-1173) was added to the mixture and dispersed uniformly by means of a planetary mixer, whereby a curable resin composition was obtained.

(2) Production of Cured Product Sheet

The curable resin composition obtained in (1) was sandwiched between two mold-releasing films composed of PET and was irradiated with ultraviolet rays (1J) using a mercury lamp, whereby a sheet of the cured product having a thickness of 0.5 mm was obtained.

(3) Evaluation

The above curable resin composition and the above sheet of the cured product were evaluated as follows. The results are shown in Table 1.

(3-1) Viscosity

The viscosity of the curable resin composition was measured by means of an E type viscometer (25° C.).

(3-2) Refractive Index

The refractive index of each of the curable resin composition and the sheet of the cured product was measured by means of an Abbe refractometer (Na D line (589 nm), 25° C.). In the case of the sheet of the cured product, the measurement was performed using matching oil.

(3-3) Cut-Off Wavelength

The transmission spectrum of the curable resin composition was measured to determine the cut-off wavelength. It is practically necessary that the cut-off wavelength be sufficiently less than 440±20 nm, which is the wavelength of the light emitted from a blue LED.

(3-4) Light Resistance Test

The sheet of the cured product was used as a test piece, and a light resistance test under an ultraviolet carbon arc lamp for 96 hours was performed according to JIS A1415.

(3-5) Heat Resistance Test

The sheet of the cured product was used as a test piece, and a heat resistance test was performed in which the test piece was left to stand in air at 150° C. for 96 hours. Then, the change in transparency before and after the test was visually observed.

(3-6) Shore-A Hardness

The Shore-A hardness (at room temperature) of the sheet of the cured product was measured according to ASTM D2240 by means of a type-A durometer.

Examples 2 to 22 and Comparative Examples 1 and 2

The same procedure as in Example 1 was repeated except that the composition was changed as shown in Table 1, whereby each of the curable resin compositions and the sheet of the cured product thereof were produced. When PER-HEXA O (NOF CORPORATION) was used as the curing agent, the composition was cured by heat-treatment at 80° C. for 1 hour.

Each of the obtained curable resin compositions and each of the sheets of the cured products were evaluated for the viscosity, refractive index, cut-off wavelength, light resistance, and heat resistance as in Example 1. The results are shown in Table 1.

In Examples 1 to 5, 2-(2-acryloxyethoxy)biphenyl (refractive index: 1.5785) was used as the high refractive index acrylic-based monomer, and powder of the cured product of N-vinylcarbazole (refractive index: 1.68) was used as the non-polymerizable carbazole. As can be seen from the results of Examples 1 to 5 in Table 1, even when the mixing amount of the non-polymerizable carbazole was increased, the cut-off wavelength was hardly shifted to the longer wavelength side, i.e., the transparency was not reduced, and the addition of the powder of the cured product of N-vinylcarbazole significantly increased the refractive index.

In Examples 6 to 10, 2-(2-acryloxyethoxy)biphenyl (refractive index: 1.5785) was used as the high refractive index acrylic-based monomer, and N-phenylcarbazole (refractive index: 1.68) was used as the non-polymerizable carbazole. As can be seen, even when the mixing amount of the non-polymerizable carbazole was increased, the cut-off wavelength was hardly shifted to the longer wavelength side, and the transparency was not reduced. Also in this case, the refractive index was significantly increased.

In Examples 11 to 14, 2-(2-acryloxyethoxy)biphenyl (refractive index: 1.5785) was used as the high refractive index acrylic-based monomer, and powder of the cured product of N-(2-acryloyloxyethyl)carbazole (refractive index: 1.64) was used as the non-polymerizable carbazole. As can be seen, even when the mixing amount of the non-polymerizable carbazole was increased, the cut-off wavelength was hardly shifted to the longer wavelength side, and the transparency was not reduced. Also in this case, the refractive index increased.

Moreover, it was confirmed that the powder of the cured product of N-(2-acryloyloxyethyl)carbazole exhibited excellent compatibility with the high refractive index acrylic-based monomer and was not phase-separated even when polymerized with the high refractive index acrylic-based monomer, whereby a uniform transparent cured product was obtained.

In Examples 15 to 17, 9,9-bis(4-(2-acryloxyethoxy)phenyl)fluorene (Osaka Gas Chemicals Co., Ltd., BPEF-A) having a particularly high refractive index (refractive index: 1.614) and also paracumylphenoxyethyl acrylate (TOAGOSEI CO., LTD., ARONIX M110, refractive index: 1.564) were used as the high refractive index acrylic-based monomers, and powder of the cured product of N-vinylcarbazole (refractive index: 1.68) or N-phenylcarbazole (refractive index: 1.68) was used as the non-polymerizable carbazole. As can be seen, in each case, a curable resin composition which gives a cured product having an extremely high refractive index can be obtained.

As can be seen from Examples 18 and 19, when butyl acrylate or phenoxyethyl acrylate was also used, the viscosity of the curable resin composition can be adjusted to a low value. In addition to this, the sheet of the cured product of the resin composition had a low Shore-A hardness and therefore was soft.

As can be seen from Example 20, when the polymerizable carbazole was also used, the viscosity of the curable resin composition can be adjusted to a high value. In addition to this, a larger amount of the carbazole compounds can be mixed without loosing the transparency, whereby the refractive index can be increased.

As can be seen from Examples 21 and 22, when 2-methyl-2-adamantyl methacrylate or isobornyl acrylate was also used, the cut-off wavelength was shifted to the shorter wavelength side, and therefore the transparency was improved.

As can be seen from Comparative Examples 1 and 2, when the polymerizable carbazole was used without using the non-polymerizable carbazole, the Shore A hardness of the sheet of the cured product was higher than that in each of the Examples, and the cured product was hard and brittle. Therefore, peeling and a break in wiring are likely to occur in LED chips.

It should be noted that the Shore A hardness of each of Examples 2 to 4 is between the Shore A hardness of Example 1 and the Shore A hardness of Example 5, and that the Shore A hardness of each of Examples 7 to 9 is between the Shore A hardness of Example 6 and the Shore A hardness of Example 10. Furthermore, the Shore A hardness of each of Examples 12 and 13 is between the Shore A hardness of Example 11 and the Shore A hardness of Example 14.

TABLE 1

| | Composition | | | | | Evaluation | |
|---|---|---|---|---|---|---|---|
| | High refractive index acrylic-based monomer (parts by weight) | Additional monomer (parts by weight) | Non-polymerizable carbazole (parts by weight) | Polymerizable carbazole (parts by weight) | Curing agent (parts by weight) | Viscosity of composition (mPa) | Cut-off wavelength of composition (nm) |
| Ex. 1 | (*1) 91 | | (*2) 9 | | (*3) 1 | 500 | 355 |
| Ex. 2 | 83 | | 17 | | 1 | 2000 | |
| Ex. 3 | 77 | | 23 | | 1 | 12000 | 360 |
| Ex. 4 | 67 | | 33 | | 1 | 380000 | 365 |
| Ex. 5 | 57 | | 43 | | 1 | 16000000 | |
| Ex. 6 | (*1) 91 | | (*4) 9 | | (*3) 1 | 150 | 355 |
| Ex. 7 | 83 | | 17 | | 1 | 170 | |

TABLE 1-continued

| | | | | | | | | | | |
|---|---|---|---|---|---|---|---|---|---|---|
| Ex. 8 | | 77 | | | 23 | | | 1 | 240 | 357 |
| Ex. 9 | | 67 | | | 33 | | | 1 | 450 | 360 |
| Ex. 10 | | 50 | | | 50 | | | 1 | 800 | |
| Ex. 11 | (*1) | 91 | | (*5) | 9 | | (*3) | 1 | 800 | 355 |
| Ex. 12 | | 83 | | | 17 | | | 1 | 3000 | |
| Ex. 13 | | 77 | | | 23 | | | 1 | 15000 | 357 |
| Ex. 14 | | 67 | | | 33 | | | 1 | 250000 | 360 |
| Ex. 15 | (*6) | 60.6 | | (*2) | 9.0 | | (*3) | 1 | 360000 | 355 |
| | (*7) | 30.4 | | | | | | | | |
| Ex. 16 | (*6) | 44.4 | | (*4) | 33.4 | | (*3) | 1 | 43000 | 360 |
| | (*7) | 22.2 | | | | | | | | |
| Ex. 17 | (*6) | 33.4 | | | 50.0 | | | 1 | 120000 | 360 |
| | (*7) | 16.6 | | | | | | | | |
| Ex. 18 | (*7) | 20.0 | (*8) | 30.0 | (*4) | 30.0 | | (*10) | 1 | 30 | |
| | | | (*9) | 20.0 | | | | | | | |
| Ex. 19 | (*7) | 35.0 | (*9) | 35.0 | (*4) | 30.0 | | (*10) | 1 | 80 | |
| Ex. 20 | (*7) | 40.0 | | | (*4) | 30.0 | (*11) 30.0 | (*10) | 1 | 8000 | |
| Ex. 21 | (*7) | 35.0 | (*12) | 35.0 | (*4) | 30.0 | | (*10) | 1 | 85 | 350 |
| Ex. 22 | (*7) | 35.0 | (*13) | 35.0 | (*4) | 30.0 | | (*10) | 1 | 80 | 350 |
| Comp. Ex. 1 | (*6) | 44.4 | | | | | (*14) 33.4 | (*3) | 1 | 20000 | 365 |
| | (*7) | 22.2 | | | | | | | | | |
| Comp. Ex. 2 | (*6) | 33.4 | | | | | (*14) 50 | | 1 | 80000 | 365 |
| | (*7) | 16.6 | | | | | | | | | |

| | Evaluation | | | | |
|---|---|---|---|---|---|
| | Refractive index of composition | Refractive index of sheet of cured product | Light resistance | Heat resistance | Shore-A hardness (rt) |
| Ex. 1 | 1.5905 | 1.621 | No change | No change | A70 |
| Ex. 2 | 1.6007 | 1.632 | No change | No change | |
| Ex. 3 | 1.6088 | 1.639 | No change | No change | |
| Ex. 4 | 1.6218 | 1.652 | No change | No change | |
| Ex. 5 | 1.6345 | 1.665 | No change | No change | A65 |
| Ex. 6 | 1.5896 | 1.620 | No change | No change | A70 |
| Ex. 7 | 1.5985 | 1.629 | No change | No change | |
| Ex. 8 | 1.6051 | 1.635 | No change | No change | |
| Ex. 9 | 1.6175 | 1.648 | No change | No change | |
| Ex. 10 | 1.6361 | 1.666 | No change | No change | A65 |
| Ex. 11 | 1.5837 | 1.615 | No change | No change | A70 |
| Ex. 12 | 1.5868 | 1.618 | No change | No change | |
| Ex. 13 | 1.5906 | 1.623 | No change | No change | |
| Ex. 14 | 1.5960 | 1.628 | No change | No change | A65 |
| Ex. 15 | 1.6063 | 1.637 | No change | No change | A93 |
| Ex. 16 | 1.6286 | 1.662 | No change | No change | A93 |
| Ex. 17 | 1.6481 | 1.680 | No change | No change | A85 |
| Ex. 18 | 1.5444 | 1.569 | No change | No change | A20 |
| Ex. 19 | 1.5800 | 1.605 | No change | No change | A55 |
| Ex. 20 | 1.6297 | 1.654 | No change | No change | A90 |
| Ex. 21 | 1.5726 | 1.597 | No change | No change | A92 |
| Ex. 22 | 1.5641 | 1.589 | No change | No change | A93 |
| Comp. Ex. 1 | 1.6057 | 1.639 | No change | No change | A98 |
| Comp. Ex. 2 | 1.6150 | 1.648 | No change | No change | A98 |

Notes
(*1) 2-(2-Acryloxyethoxy)biphenyl (TOAGOSEI CO., LTD., TO1463)
(*2) Powder of cured product of N-vinylcarbazole (Tokyo Chemical Industry Co., Ltd.)
(*3) Photoinitiator (Ciba Specialty Chemicals, D-1173)
(*4) N-phenylcarbazole
(*5) Powder of cured product of N-(2-acryloyloxyethyl)carbazole (obtained by curing monomer from NIHON JYORYU CO., LTD. and reprecipitating the resultant)
(*6) 9,9-Bis(4-(2-acryloxyethoxy)phenyl)fluorene (Osaka Gas Chemicals Co., Ltd., BPEF-A)
(*7) Paracumylphenoxyethyl acrylate (TOAGOSEI CO., LTD., ARONIX M110)
(*8) Butyl acrylate
(*9) Phenoxyethyl acrylate (OSAKA GAS CHEMICAL INDUSTRY LTD., Viscoat V192)
(*10) NOF CORPORATION, PERHEXA O
(*11) N-(2-acryloyloxyethyl)carbazole (NIHON JYORYU CO., LTD.)
(*12) 2-Methyl-2-adamantyl methacrylate (Idemitsu Kosan Co., Ltd., Adamantate MM)
(*13) Isobornyl acrylate (Shin-nakamura Chemical Corporation, NK ester A-IB)
(*14) N-(2-acryloyloxyethyl)carbazole (NIHON JYORYU CO., LTD.)

INDUSTRIAL APPLICABILITY

The curable resin composition of the present invention is useful as an optically encapsulating curable resin composition for LEDs, optical discs, and light-emitting devices such as lasers and is particularly useful as an encapsulating resin composition for high intensity LEDs.

Moreover, light-emitting devices encapsulated with the curable resin composition of the present invention may be used in a wide variety of fields such as backlight of flat panels, traffic signals, lamps for advertising boards, and headlamps for automobiles.

The invention claimed is:

1. A curable resin composition comprising a high refractive index acrylic-based monomer having a refractive index of 1.52 or more and a non-polymerizable carbazole.

2. The curable resin composition according to claim 1, further comprising a polymerizable carbazole.

3. The curable resin composition according to claim 1, wherein a total amount of the high refractive index acrylic-based monomer and the carbazole is 50% by weight or more.

4. The curable resin composition according to claim 1, wherein a refractive index of a cured product thereof is 1.55 or more.

5. The curable resin composition according to claim 1, wherein the high refractive index acrylic-based monomer is an acrylate or a methacrylate having a fluorene skeleton, a bisphenol-A skeleton, a biphenyl skeleton, a naphthalene skeleton, or an anthracene skeleton.

6. The curable resin composition according to claim 1, wherein the high refractive index acrylic-based monomer is one or two or more selected from a fluorene group-containing acrylate or methacrylate represented by the following formula (1) and a monofunctional acrylate or methacrylate represented by the following formula (2):

[Chemical Formula 8]

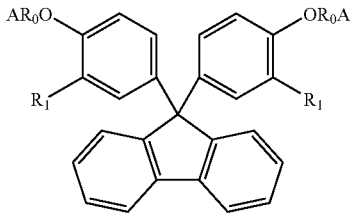

(1)

(where A is an acrylic group or a methacrylic group, $R_0$ is $-(CH_2CH_2O)_n-$ or $-(CH_2CH_2O)_n-CH_2CH(OH)CH_2O-$ with n being 1 to 5, and $R_1$ is a hydrogen atom or a methyl group)

[Chemical Formula 9]

(2)

(where A is an acrylic or methacrylic group, X is a phenyl group, a cumylphenyl group, a biphenyl group, a terphenyl group, or a polycyclic aromatic hydrocarbon group, and Y is $-(CH_2CH_2O)_n-$ or $-(CH_2CH_2CH_2O)_n-$ with n being 1 to 5 or is $-(CH_2CH_2O)_{n1}-(CH_2CH_2CH_2O)_{n2}-$ with n1+n2 being 2 to 5).

7. The curable resin composition according to claim 1, wherein the non-polymerizable carbazole is an N-substituted carbazole represented by the following formula (3):

[Chemical Formula 10]

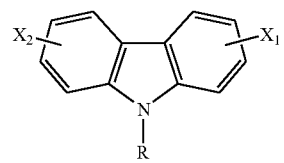

(3)

(where R is a hydrogen atom, a methyl group, an ethyl group, or a phenyl group, and X1 and X2 are each a hydrogen atom, a methyl group, a methoxy group, or a hydroxyl group).

8. The curable resin composition according to claim 1, wherein ultra-fine particles having a refractive index greater than that of a mixture of the high refractive index acrylic-based monomer and the non-polymerizable carbazole are dispersed.

9. An optically encapsulating curable resin composition comprising the curable resin composition according to claim 1.

10. A cured product prepared by curing the curable resin composition according to claim 1.

11. A light-emitting device encapsulated with the curable resin composition according to claim 9.

* * * * *